(12) United States Patent
Kang

(10) Patent No.: US 7,362,638 B2
(45) Date of Patent: Apr. 22, 2008

(54) SEMICONDUCTOR MEMORY DEVICE FOR SENSING VOLTAGES OF BIT LINES IN HIGH SPEED

(75) Inventor: Khil-Ohk Kang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 455 days.

(21) Appl. No.: 11/017,641

(22) Filed: Dec. 22, 2004

(65) Prior Publication Data

US 2005/0226025 A1    Oct. 13, 2005

(30) Foreign Application Priority Data

Mar. 31, 2004    (KR) ...................... 10-2004-0022180

(51) Int. Cl.
*G11C 7/02* (2006.01)
(52) U.S. Cl. .................. 365/208; 365/207; 365/230.03
(58) Field of Classification Search ........... 365/189.01, 365/190, 207, 208, 230.03
See application file for complete search history.

(56) References Cited

U.S. PATENT DOCUMENTS 6,522,565 B2 * 2/2003 Shimazaki et al. ........... 365/63

6,804,163 B2    10/2004 Lee et al.
2005/0007849 A1    1/2005 Sommer

FOREIGN PATENT DOCUMENTS

| JP | 2004-031908 | 1/2004 |
|---|---|---|
| KR | 1020020035907 | 5/2002 |
| KR | 1020030094548 | 12/2003 |

* cited by examiner

*Primary Examiner*—VanThu Nguyen
(74) *Attorney, Agent, or Firm*—Lowe Hauptman Ham & Berner LLP

(57) ABSTRACT

The present invention relates to a semiconductor memory device for sensing voltages of bit lines in high speed. The semiconductor memory device for sensing voltages of bit lines in high speed includes: a first bit line pair to a fourth bit line pair each coupled to a different unit cell array; a bit line sense amplifying means coupled to the first bit line pair to the fourth bit line pair for amplifying data transmitted through the first bit line pair to the fourth bit line pair; and a switching block for connecting one of the first bit line pair to the fourth bit line pair with the bit line sense amplifying means in response to a control signal.

2 Claims, 5 Drawing Sheets

SEMICONDUCTOR MEMORY DEVICE FOR SENSING VOLTAGES OF BIT LINES IN HIGH SPEED

FIELD OF THE INVENTION

The present invention relates to a semiconductor memory device; and, more particularly, to a semiconductor memory device capable of sensing and amplifying a voltage between a pair of bit lines in high speed.

DESCRIPTION OF RELATED ARTS

Generally, in a dynamic random access memory device (DRAM), it is mandated to amplify data stored into memory cells with use of a bit line sense amplifier for a read operation and a refresh operation. Particularly, when a row address is inputted, data of memory cells connected to a word line activated in response to the inputted row address are inputted in a low voltage level to a pair of bit lines. A bit line sense amplifier including a number of transistors connected with each other in latch type senses the inputted low voltage level and then amplifies the sensed voltage into a logic level.

FIG. 1 is a block diagram showing how bit lines and bit line sense amplifiers of a conventional DRAM are connected and arranged with each other.

As shown, the conventional DRAM includes L number of memory cell array blocks, i.e., a first cell array block 10 to an Lth memory cell array block 40L. Each of the first to the Lth memory cell array blocks 10 to 40L includes n number of word lines and m number of bit line pairs. Herein, L, n and m are positive numbers. For instance, the first memory cell array block 10 includes a first word line 1WL1 to an nth word line 1WLn and a first pair of bit lines 1*b*/1 and /1*b*/1 to an mth pair of bit lines 1*blm* and /1*blm*. Also, there are (L+1) number of bit line sense amplifier blocks for amplifying sensed data of a pair of bit lines inputted in a voltage level, i.e., a first bit line sense amplifier block 50 to an (L+1)th bit line sense amplifier block 90L. Especially, each of the (L+1) number of bit line sense amplifier blocks is arranged correspondingly in between the each two of the Lth number of memory cell array blocks. Each of the (L+1) number of bit line sense amplifier blocks includes m number of bit line sense amplifiers. For instance, the first bit line sense amplifier block 50 includes a fist bit line sense amplifier 1SA1 to an mth bit line sense amplifier 1SA(m).

If one of the word lines, e.g., the first word line 1WL1 of the first memory cell array block 10 is activated, the first bit line sense amplifier block 50 and the second bit line sense amplifier block 60 of the memory cell array block 10 that includes the activated first word line 1WL1 amplify voltage levels of the corresponding pairs of bit lines, in this case, the first pair of bit lines to the mth pair of bit lines (1*b*/1, /1*b*/1, 1*b*/2, /1*b*/2, . . . , 1*blm*, /1*blm*) to which data are inputted in response to the activated first word line 1WL1.

That is, data of the selected memory cell array block are amplified by the corresponding bit line sense amplifier blocks disposed above and beneath the selected memory cell array block. In other words, the selected bit line sense amplifier block is shared by the respective memory cell array blocks disposed above and beneath the selected bit line sense amplifier block. This specific structure of the bit line sense amplifier is called a shared bit line sense amplifier.

FIG. 2 is an inner circuit diagram of conventional bit line sense amplifiers. Particularly, among m number of bit line sense amplifiers of a third bit line sense amplifier block 70, a first bit line sense amplifier 3SA1 and a second bit line sense amplifier 3SA2 shown in FIG. 1 are selected as an example. Herein, the first bit line sense amplifier 3SA1 and the second bit line sense amplifier 3SA2 of the third bit line sense amplifier block 70 are denoted with reference numerals 71 and 72, respectively.

As shown in FIG. 2, the first bit line sense amplifier 71 senses and amplifies voltage levels of first pairs of bit lines 1*b*/1, /2*b*/1 and 3*b*/1, /3*b*/1 connected with a top memory cell array block 210 and a bottom memory cell array block 240, respectively. Therefore, when the top memory cell array block 210 is activated, a bottom bit line control signal bisl is inactivated, thereby blocking data of the bottom memory cell array block 240 from being inputted. The second bit line sense amplifier 72 has the same arrangement and connection to those of the first bit line sense amplifier 71.

Meanwhile, in a conventional DRAM, one selected bit line sense amplifier amplifies voltage levels of each one pair of bit lines of the top memory cell array block and the bottom memory cell array block and thus, one bit line sense amplifier is placed in between two pairs of bit lines each pair belonging to the different memory cell array blocks. As a result, the bit line sense amplifier is placed within a limited area, thereby delaying a processing time for sensing and amplifying voltage levels of bit line pairs. That is, a sensing speed of the bit line sense amplifier is determined by a width of a transistor included in the bit line sense amplifier. As the occupying area of the bit line sense amplifier decreases, the width of the transistor decreases, thereby degrading performance of the bit line sense amplifier.

SUMMARY OF THE INVENTION

It is, therefore, an object of the present invention to provide a semiconductor memory device capable of improving an operation speed of sensing and amplifying a voltage level of a bit line by giving a layout that allows a width of a transistor of a bit line sense amplifier to be widened approximately twice.

In accordance with an aspect of the present invention, there is provided a semiconductor memory device, including: a first bit line pair to a fourth bit line pair each coupled to a different unit cell array; a bit line sense amplifying means coupled to the first bit line pair to the fourth bit line pair for amplifying data transmitted through the first bit line pair to the fourth bit line pair; and a switching block for connecting one of the first bit line pair to the fourth bit line pair with the bit line sense amplifying means in response to a control signal.

In accordance with another aspect of the present invention, there is provided a semiconductor memory device, including: a plurality of memory cell array blocks including a first bit line pair and a second bit line pair neighbored with each other; a first bit line sense amplifying means being disposed between a first memory cell array block and a second memory cell array block allocated in proximity among the plurality of memory cell array blocks and serving a role in sensing and amplifying a voltage level of a bit line pair selected one of each first bit line pair of the first memory cell array block and the second cell array block and each second bit line pair of a third memory cell array block and a fourth memory cell array block disposed adjacent to a top portion of the first memory cell array block and to a bottom portion of the second memory cell array block, respectively; and a second bit line sense amplifying means being disposed in a top portion of the third memory cell array block and serving a role in sensing and amplifying a voltage level of one bit line pair selected from a first bit line pair of the third memory cell array block and a second bit line pair of the first memory cell array block.

In accordance with still another aspect of the present invention, there is provided a semiconductor memory device, including: a plurality of pairs of bit lines extending in parallel in a column direction; a plurality of word lines extending in parallel in a row direction; a plurality of memory cell array blocks each having a predetermined number of the word lines; and a plurality of sense amplifier array blocks each disposed between the adjacent memory cell array blocks and having sense amplifiers each arranged for every four bit line pairs in view of a plane level.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor memory device for sensing and amplifying a voltage of a bit line in high speed in accordance with a preferred embodiment of the present invention will be described in detail with reference to the accompanying drawings.

Figure 3:
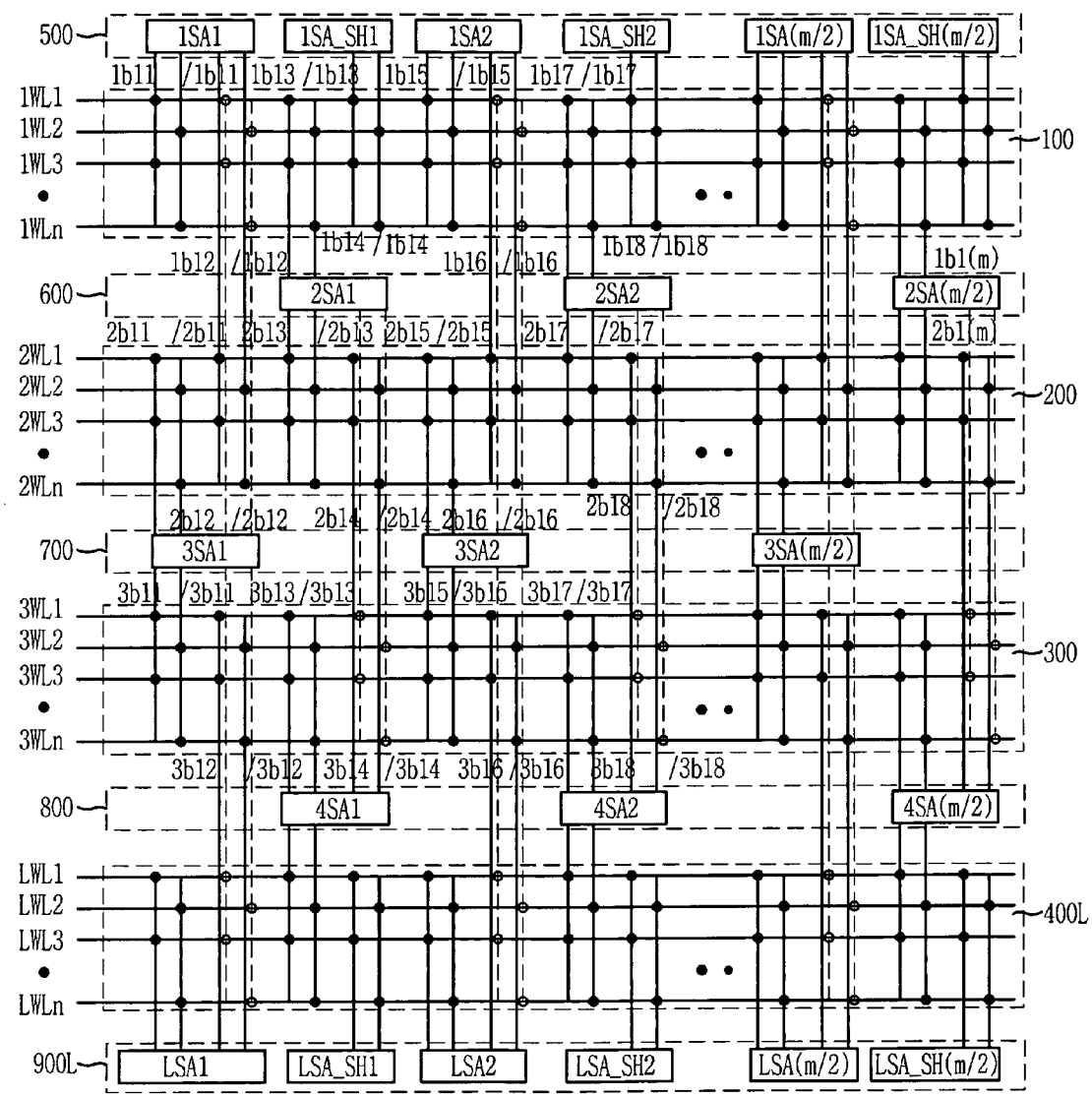
FIG. 3 is a block diagram showing how bit lines and bit line sense amplifiers of memory cell array blocks are arranged and connected with each other in accordance with the present invention.

FIG. 3 is a block diagram showing how bit lines and bit line sense amplifiers of memory cell array blocks in a dynamic random access memory device (DRAM) are arranged and connected with each other in accordance with the present invention.

As shown, the DRAM includes L number of memory cell array blocks, i.e., a first memory cell array block 100 to an Lth memory cell array block 400L. The L number of memory cell array blocks includes n number of word lines and m number of bit line pairs. Herein, L, n and m are positive numbers. For instance, the first memory cell array block 100 includes a first word line 1WL1 to an nth word line 1WLn and a first pair of bit lines 1b/1 and /b11 to an mth pair of bit lines 1blm and /1blm. Also, there are (L+1) number of bit line sense amplifier blocks for sensing and amplifying voltage levels of bit line pairs (bl1, /bl1, bl2, /bl2, . . . , blm, /blm) included in each two of memory cell array blocks disposed above and beneath the selected bit line sense amplifier block. That is, there are a first bit line sense amplifier block 500 to an (L+1)th bit line sense amplifier block 900L.

Also, a second pair of bit lines (1bl2, /1bl2) of the first memory cell array block 100 and a second pair of bit lines (2bl2, /2bl2) of the second memory cell array block 200 are wired with overlapped portions with each other and thus, these mentioned pairs of bit lines are denoted with different lines to distinguish these mentioned pairs of bit lines from each other. That is, in respect of a cross-sectional view, these mentioned pairs of bit lines 1bl2, /1bl2 and 2bl2, /2bl2 are connected to the corresponding bit line sense amplifiers in different layers through a first interconnection wire and a second interconnection wire, respectively.

Next, the arrangement of the first bit line sense amplifier block 500 to the (L+1)th bit line sense amplifier block 900L are explained based on one exemplary bit line sense amplifier block. Herein, the third bit line sense amplifier block 700 is selected as the exemplary arrangement. Each of the first memory cell array block 100 to the Lth memory cell array block 400L includes the first pair of bit lines bl1 and /bl1 and the second pair of bit lines bl2 and /bl2.

The third bit line sense amplifier block 700 is placed between the second memory cell array block 200 and the third memory cell array block 300 and includes a number of bit line sense amplifiers 3SA1 to 3SA(m/2) for sensing and amplifying voltages of the selected pair of bit lines among the first pair of bit lines 2b/1 and /2b/1 of the second memory cell array block 200, the first pair of bit lines 3b/1 and /3b/1 of the third memory cell array block 300, the second pair of bit lines 1b/2 and /1b/2 of the first memory cell array block 100 disposed adjacently in an upper portion of the second memory cell array block 200, and the second pair of bit lines 4b/2 and /4b/2 of the fourth memory cell array block 400 disposed adjacently in a bottom portion of the third memory cell array block 300.

In other words, it is necessary to have each two bit line sense amplifier blocks in top and bottom portions of the memory cell array block having an activated word line in order to sense and amplify the voltage level of the bit line pair as the word line is activated.

However, the first memory cell array block 100 includes one bit line sense amplifier block in a top position, i.e., the first bit line sense amplifier block 500 and two bit line sense amplifier blocks in a bottom position, i.e., the second bit line sense amplifier block 600 and the third bit line sense amplifier block 700. Thus, the first memory cell array block 100 has one less top bit line sense amplifier block. As a result, this shortage of the top bit line sense amplifier block is compensated by employing conventional shared bit line sense amplifiers 1SA_SH1, 1SA_SH2, . . . , 1SA_SH(m/2). Identically, the Lth memory cell array block 400L disposed in the bottom most position employs the conventional shared bit line sense amplifiers LSA_SH1, LSA_SH2, . . . , LSA_SH(m/2).

Figure 1:
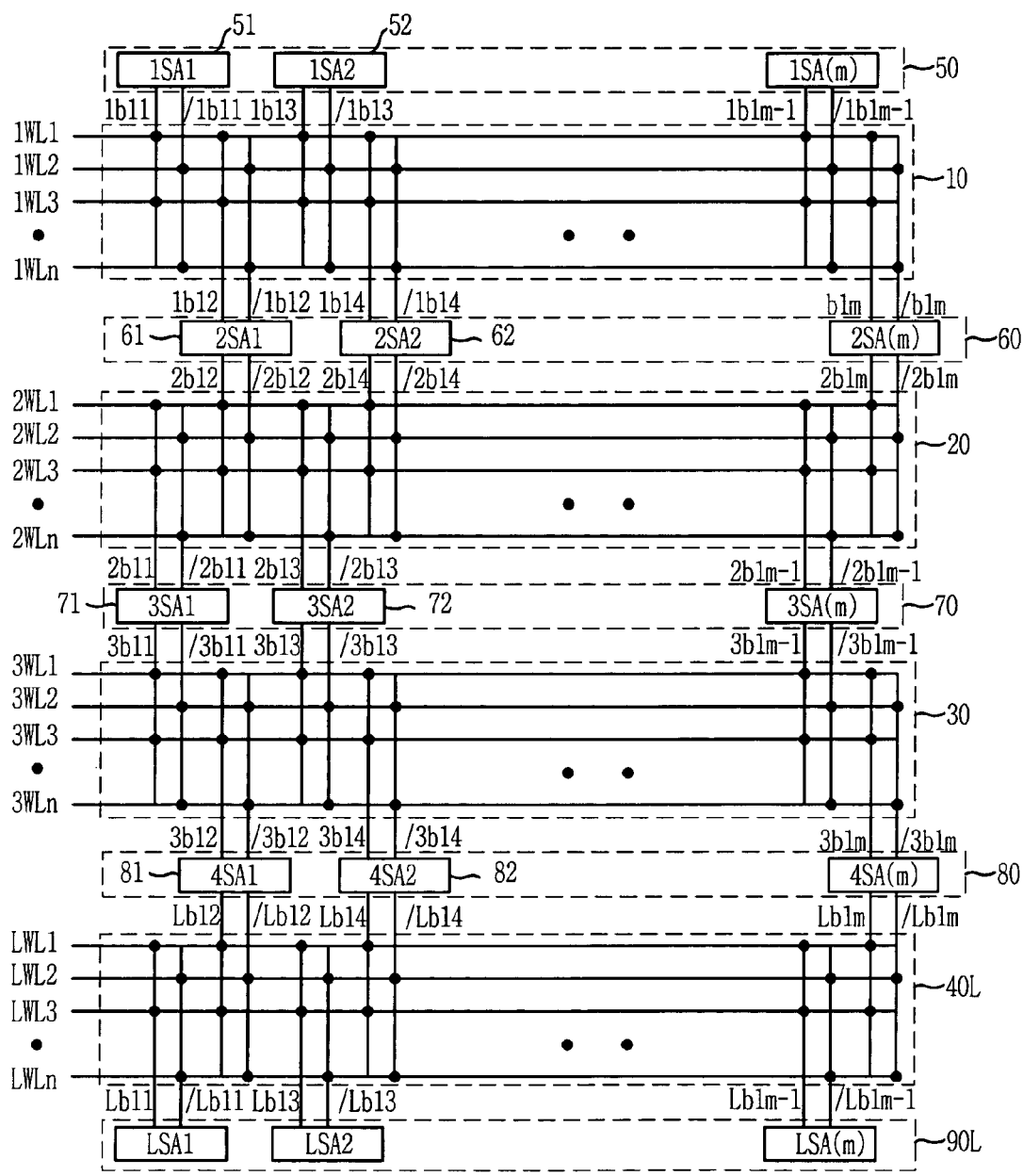
FIG. 1 is a block diagram showing how bit lines and bit line sense amplifiers of memory cell array blocks are arranged and connected with each other in a conventional dynamic random access memory device.
Figure 2:
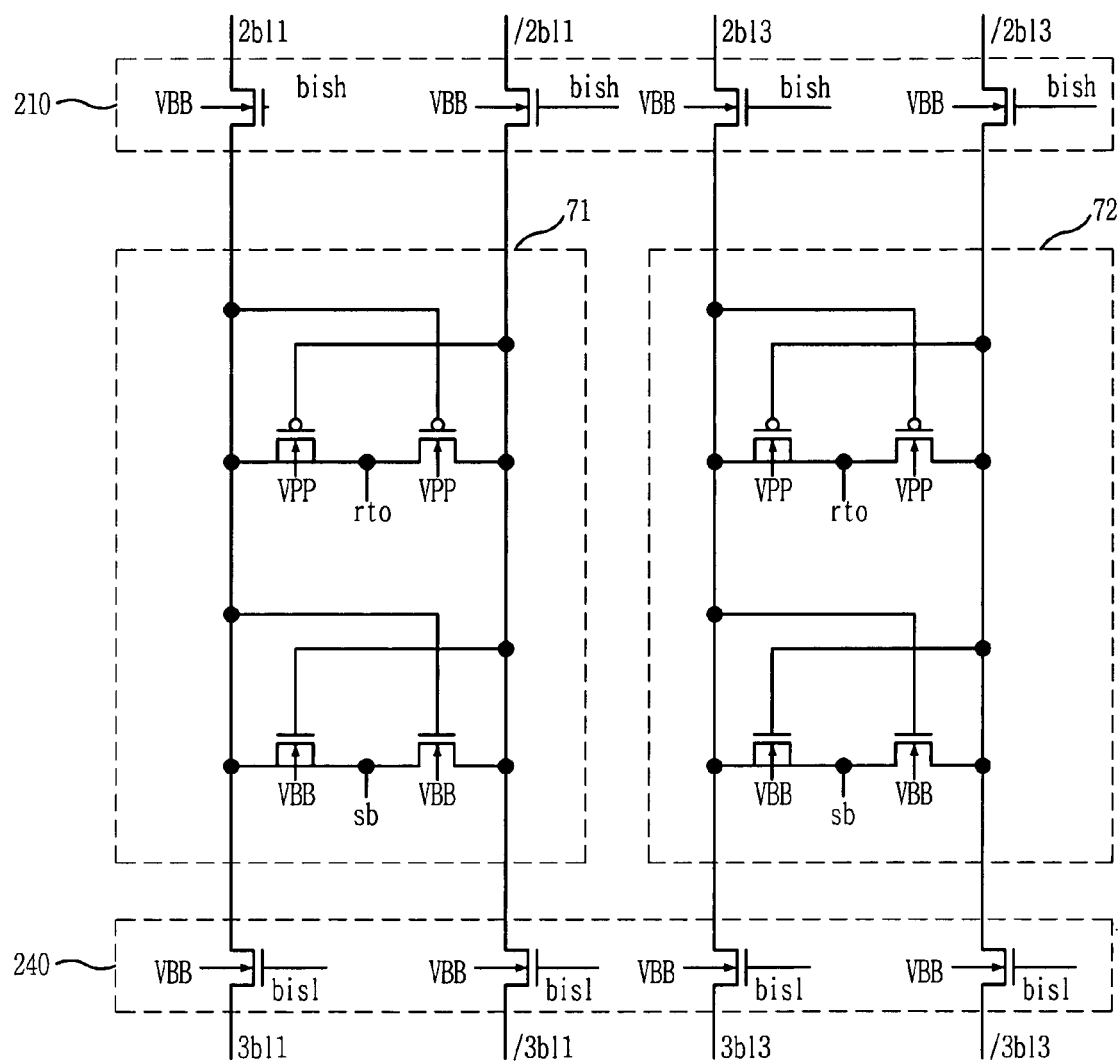
FIG. 2 is an inner circuit diagram of the selected bit line sense amplifier shown in FIG. 1.

Meanwhile, In comparison with the conventional bit line sense amplifiers, the number of bit line sense amplifiers in accordance with the present invention is one half of the bit line sense amplifiers of the first to the (L+1)th bit line sense amplifier blocks shown in FIG. 1.

In detail, if one word line, e.g., the third world line 3WL1, is activated, the second and the third bit line sense amplifier blocks 600 and 700 and the fourth and the fifth bit line sense amplifier blocks 800 and 900 disposed respectively in top and bottom of the third memory cell array block 300 having the activated word line 3WL1 sense and amplify voltages of a number of bit line pairs (bl1, /bl1, . . . , bl4, /bl4, . . . , bln, /bln). As a result, compared with the use of conventional bit line sense amplifiers, the number of the bit line sense amplifiers can be decreased by half.

As a reference, since the bit line sense amplifiers in accordance with the present invention amplify data of the memory cell array blocks in extended ranges, these bit line sense amplifiers are called modified extended sense amplifiers.

Figure 4:
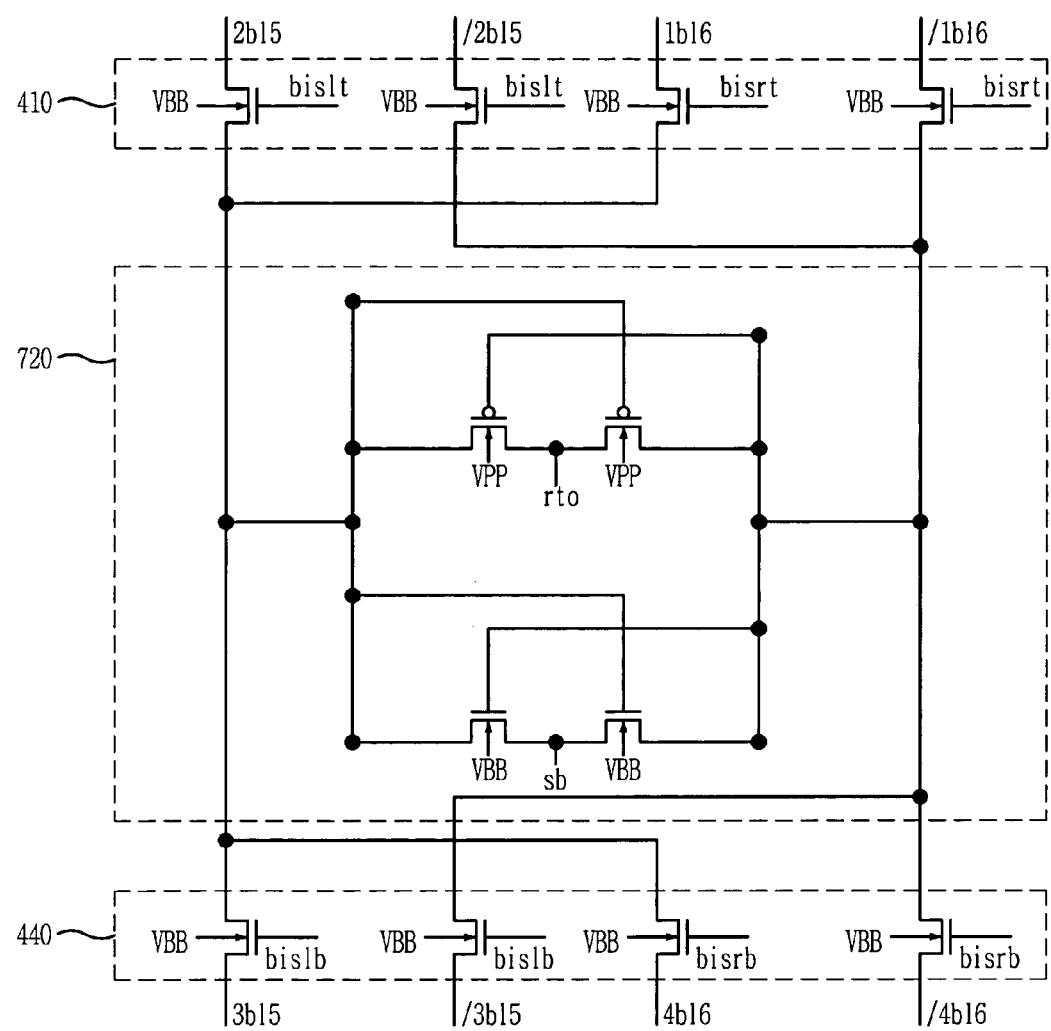
FIG. 4 is an inner circuit diagram of a bit line sense amplifier in accordance with the present invention.

FIG. 4 is an inner circuit diagram of a bit line sense amplifier in accordance with the present invention. Herein, the second bit line sense amplifier 3SA2 of the third bit line sense amplifier block 700 is exemplified, and the second bit line sense amplifier 3SA2 is denoted with a reference numeral 720.

As shown, the second bit line sense amplifier 720 is connected with two pairs of the bit lines 2*b*/5, /2*b*/5 and 1*b*/6, /1*b*/6 of a top memory cell array block 410 and with two pairs of the bit lines 4*b*/6 and /4*b*/6 and 3*b*/5 and /3*b*/5 of a bottom memory cell array block 440 to thereby sense and amplify voltage levels of these connected pairs of the bit lines 1*b*/6 and /1*b*/6, 2*b*/5 and /2*b*/5, 4*b*/6 and /4*b*/6, and 3*b*/5 and /3*b*/5.

The second bit line sense amplifier 720 senses and amplifies voltage levels of nodes to which the above pairs of the bit lines 2*b*/5 and /2*b*/5, 1*b*/6 and /1*b*/6, 4*b*/6 and /4*b*/6, and 3*b*/5 and /3*b*/5 are connected. Therefore, to prevent amplified signals from being inputted simultaneously to the node, the pair of bit lines connected to the node is selected through switches controlled by isolation signals bislt, bisrt, bislb and bisrb.

As described above, the bit line sense amplifier 720 is disposed between four pairs of the bit lines. Hence, an overall area of the memory cell array block does not increase; however, areas of P-channel metal oxide semiconductor (PMOS) transistors and N-channel metal oxide semiconductor (NMOS) transistors which are configuration devices of an actual bit line sense amplifier increase. As a result, it is possible to rapidly sense and amplify data of the bit lines.

Figure 5:
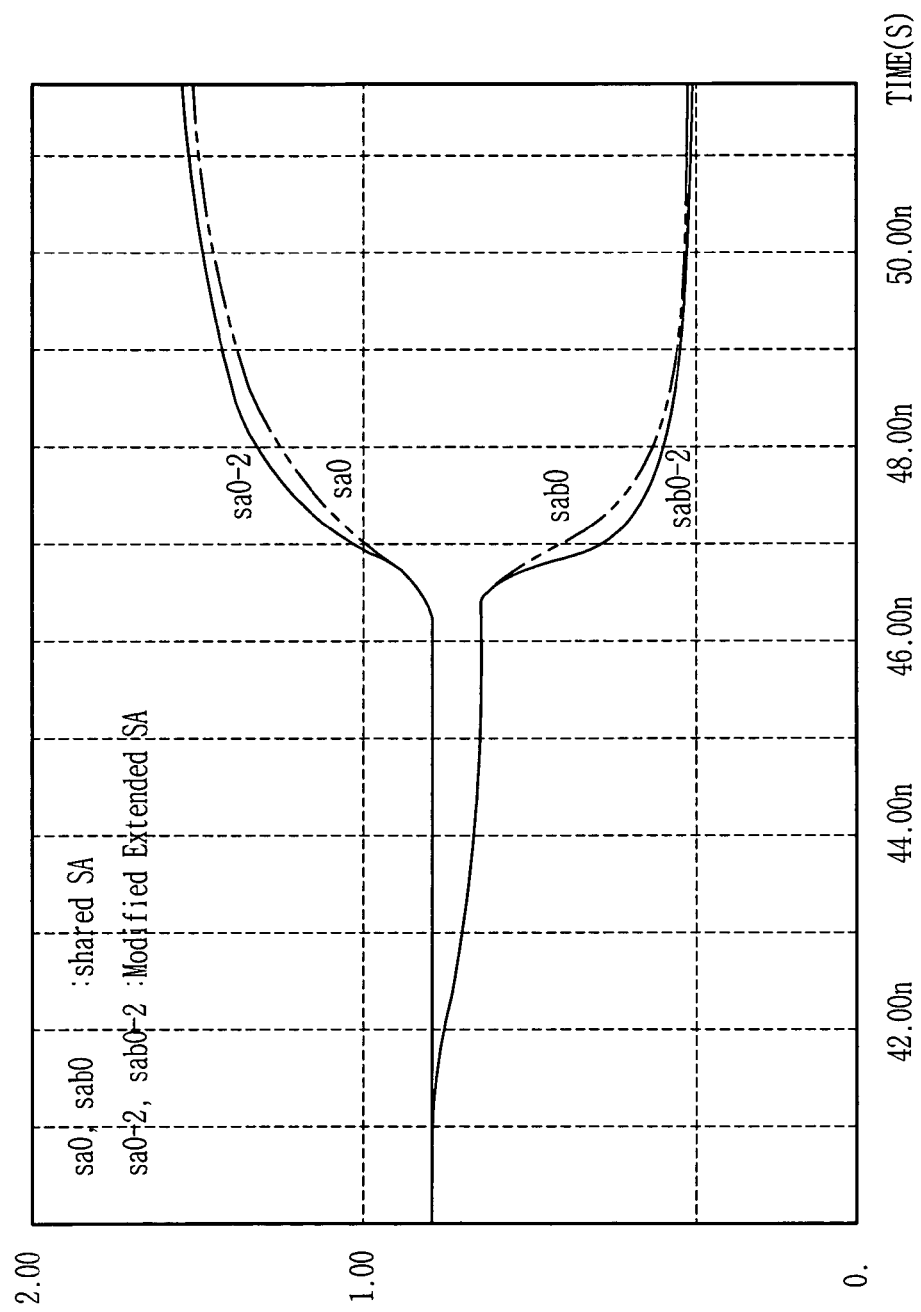
FIG. 5 is a graph showing a simulation result on a voltage change of bit line sense amplifiers in accordance with the present invention.

FIG. 5 is a graph showing a simulation result on a voltage change of bit line sense amplifiers in accordance with the present invention. In FIG. 5, 'sa0' represents a voltage of a conventional bit line sense amplifier that amplifies two pairs of bit lines, and 'sa0-2' represents a voltage of a bit line sense amplifier proposed by the present invention that amplifies four pairs of bit lines.

According to the graph shown in FIG. 5, it is confirmed that the bit line sense amplifier proposed by the present invention much rapidly senses and amplifies data of memory cell array blocks.

In accordance with the present invention, one bit line sense amplifier is allowed to sense and amplify four pairs of the bit lines of the different memory cell array blocks. Therefore, in a plane level, arrangement of one bit line sense amplifier per four pairs of the bit lines is obtained. As a result of this specific arrangement, a layout area of the sense amplifiers is widened, and this widened area further causes an area of MOS transistors which are configuration devices of the bit line sense amplifiers to be increased. Accordingly, it is possible to sense and amplify voltage levels of the bit lines in high speed.

The present application contains subject matter related to the Korean patent application No. KR 2004-0022180, filed in the Korean Patent Office on Mar. 31, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
   a first bit line pair to a fourth bit line pair each coupled to a different unit cell array;
   a bit line sense amplifying means coupled to the first bit line pair to the fourth bit line pair for amplifying data transmitted through the first bit line pair to the fourth bit line pair; and
   a switching block for connecting one of the first bit line pair to the fourth bit line pair with the bit line sense amplifying means in response to a control signal,
   wherein each of the first bit line pair and the second bit line pair makes an individual connection with the bit line sense amplifier means through a first interconnection line disposed in an identical layer, and each of the third bit line pair and the fourth bit line pair makes an individual connection with the bit line sense amplifier means through a second interconnection line disposed in a different layer from the first interconnection line.

2. The semiconductor memory device of claim 1, wherein the switching block includes:
   a first switching block for making a selective connection between the first bit line pair and the bit line sense amplifying means;
   a second switching block for making a selective connection between the second bit line pair and the bit line sense amplifying means;
   a third switching block for making a selective connection between the third bit line pair and the bit line sense amplifying means; and
   a fourth switching block for making a selective connection between the fourth bit line pair and the bit line sense amplifying means.

* * * * *